United States Patent [19]

Evans, Jr. et al.

[11] Patent Number: 5,212,620
[45] Date of Patent: May 18, 1993

[54] METHOD FOR ISOLATING SIO₂ LAYERS FROM PZT, PLZT, AND PLATINUM LAYERS

[75] Inventors: Joseph T. Evans, Jr.; Jeff A. Bullington; Carl E. Montross, Jr., all of Albuquerque, N. Mex.

[73] Assignee: Radiant Technologies, Albuquerque, N. Mex.

[21] Appl. No.: 845,064

[22] Filed: Mar. 3, 1992

[51] Int. Cl.⁵ .................. H01G 4/10; H01G 7/00; G11C 11/22
[52] U.S. Cl. .................. 361/313; 29/25.42; 361/321; 365/145
[58] Field of Search .......... 361/311, 312, 313, 321; 365/145; 29/25.42; 357/51

[56] References Cited

U.S. PATENT DOCUMENTS

| | | | |
|---|---|---|---|
| 5,003,428 | 3/1991 | Shepherd | 361/321 |
| 5,005,102 | 4/1991 | Larson | 361/313 |
| 5,046,043 | 9/1991 | Miller et al. | 365/145 |
| 5,070,026 | 12/1991 | Greenwald et al. | 365/145 X |

Primary Examiner—Donald A. Griffin
Attorney, Agent, or Firm—McCubbrey, Bartles, Meyer & Ward

[57] ABSTRACT

An improved method for constructing integrated circuit structures in which a buffer SiO₂ layer is used to separate various components comprising ferroelectric materials or platinum is disclosed. The invention prevents interactions between the SiO₂ buffer layer and the ferroelectric materials. The invention also prevents the cracking in the SiO₂ which is commonly observed when the SiO₂ layer is deposited directly over a platinum region on the surface of the circuit. The present invention utilizes a buffer layer of material which is substantially inert with respect to the ferroelectric material and which is also an electrical insulator to separate the SiO₂ layer from the ferroelectric material and/or the platinum regions.

9 Claims, 4 Drawing Sheets

METHOD FOR ISOLATING SIO₂ LAYERS FROM PZT, PLZT, AND PLATINUM LAYERS

FIELD OF THE INVENTION

The present invention relates to integrated circuits, and more particularly, to methods for isolating $SiO_2$ layers from PZT, PLZT and platinum structures therein.

BACKGROUND OF THE INVENTION

The silicon chip has become a symbol of modern electronics. Semiconductorbased devices dominate the digital electronic world, and new applications of such devices are continually being created. As these applications demand greater optimization, semiconductor devices are developed which are both smaller and faster than their predecessors.

As this optimization process continues, the physical limits of existing semiconductor technology present barriers to continued miniaturization. One such barrier is created by the necessity of the use of capacitors in these semiconductor devices to store the charge. For example, some digital memory devices typically require capacitors to retain the charge necessary to retain memory data intact. Dynamic RAMs, as such devices are called, must be refreshed periodically to prevent the data from being lost. The period of time required between such refreshes is important to computer hardware design, as more complex circuitry is required where the period is shorter.

Unfortunately, the period between required refreshes is dependent upon the capacitance of certain capacitors within the DRAM integrated circuit. Capacitance itself is related to the surface area and thickness of the capacitor, with larger and thinner capacitor surfaces providing a higher capacitance. Since there are practical limits to the minimum thickness of the capacitor, miniaturization of capacitors leads to lower capacitance and thereby a shorter period between refreshes. Since there is a minimum acceptable refresh period, some means for regaining the capacitance lost to size reduction is needed. One method for increasing the capacitance without increasing the physical dimensions of the capacitor is to utilize a material having a high dielectric constant to separate the plates of the capacitor.

A number of ferroelectric materials are known to have very high dielectric constants. Ferroelectrics such as lead zirconate titanate (PZT) and lead lanthanum zirconate titanate (PLZT) are particularly attractive in this regard, as thin films of these materials may be deposited on integrated circuits. Depending on the specific composition and manner of deposition, dielectric constants in excess of 100 are routinely achieved.

Unfortunately, these materials present a number of problems when the materials are incorporated into conventional integrated circuits. A typical ferroelectric capacitor consists of a bottom electrode, a PLZT dielectric layer, and a top electrode. The electrodes are typically constructed from Platinum. An array of such capacitors is constructed by patterning the bottom electrodes, depositing a PLZT film over the bottom electrodes, and then depositing a top layer of Platinum which is etched to form the individual top electrodes. The top surface of such a structure includes regions with exposed PLZT material and exposed areas of Platinum. The top surface of this structure is normally coated with $SiO_2$ which provides protection from scratching and acts as an interlayer dielectric for isolating metal interconnects from the top and bottom electrodes. Metal interconnects to the top and bottom electrodes are typically provided by etching via holes in the $SiO_2$ layer.

Unfortunately, the silicon in the $SiO_2$ can react with the ferroelectric materials in those regions in which the materials in question are in contact. This can lead to degraded performance from the capacitor. In addition, the capacitor may show aging effects as a result of the interaction in question. Finally, the $SiO_2$ layer has a tendency to crack when placed in contact with the Platinum electrodes. A cracked $SiO_2$ layer is a poor substrate on which to deposit the metal interconnects.

Broadly, it is the object of the present invention to provide an improved ferroelectric based capacitor structure.

It is a further object of the present invention to eliminate the cracking that occurs when the $SiO_2$ layer is placed in contact with Platinum electrodes.

It is a still further object of the present invention to provide a method for covering a ferroelectric layer with an $SiO_2$ layer without encountering the $SiO_2$ interacting with the ferroelectric material.

These and other objects of the present invention will become apparent to those skilled in the art from the following detailed description of the invention and the accompanying drawings.

SUMMARY OF THE INVENTION

The present invention comprises an improved integrated circuit construction technique and the structures produced thereby. According to the present invention, the $SiO_2$ layer is separated from the platinum or ferroelectric regions by a substantially insulating layer of material that is substantially inert with respect to the ferroelectric material. The preferred insulating materials are $TiO_2$, $ZrO_2$, MgO, PZT, or PLZT. The oxide materials are preferably produced by depositing a layer of the corresponding metal, patterning the metallic layer, and then oxidizing the metallic layer in place.

DETAILED DESCRIPTION OF THE INVENTION

Figure 1:
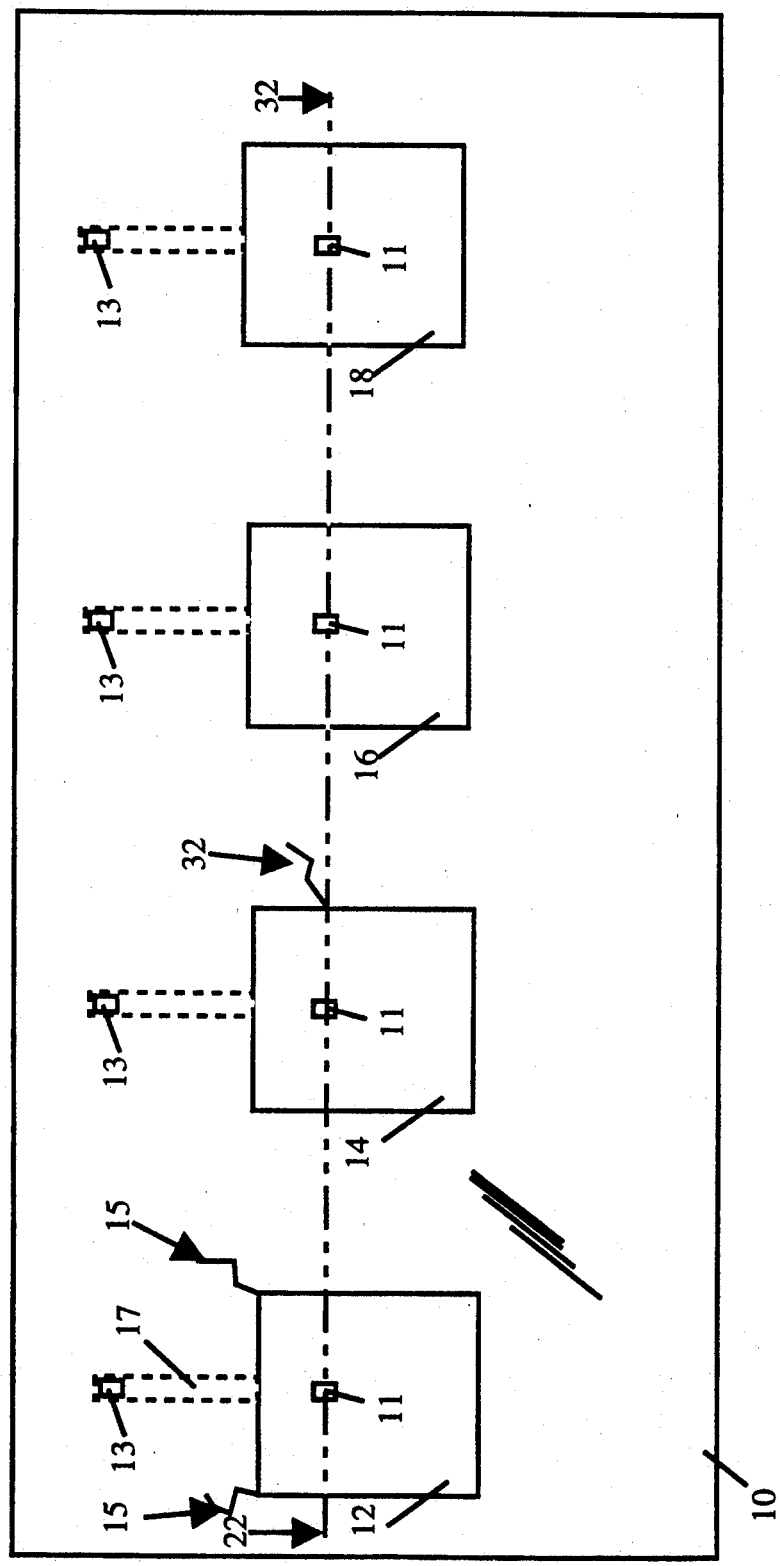
FIG. 1 is a top view of a prior art capacitor array.
Figure 2:
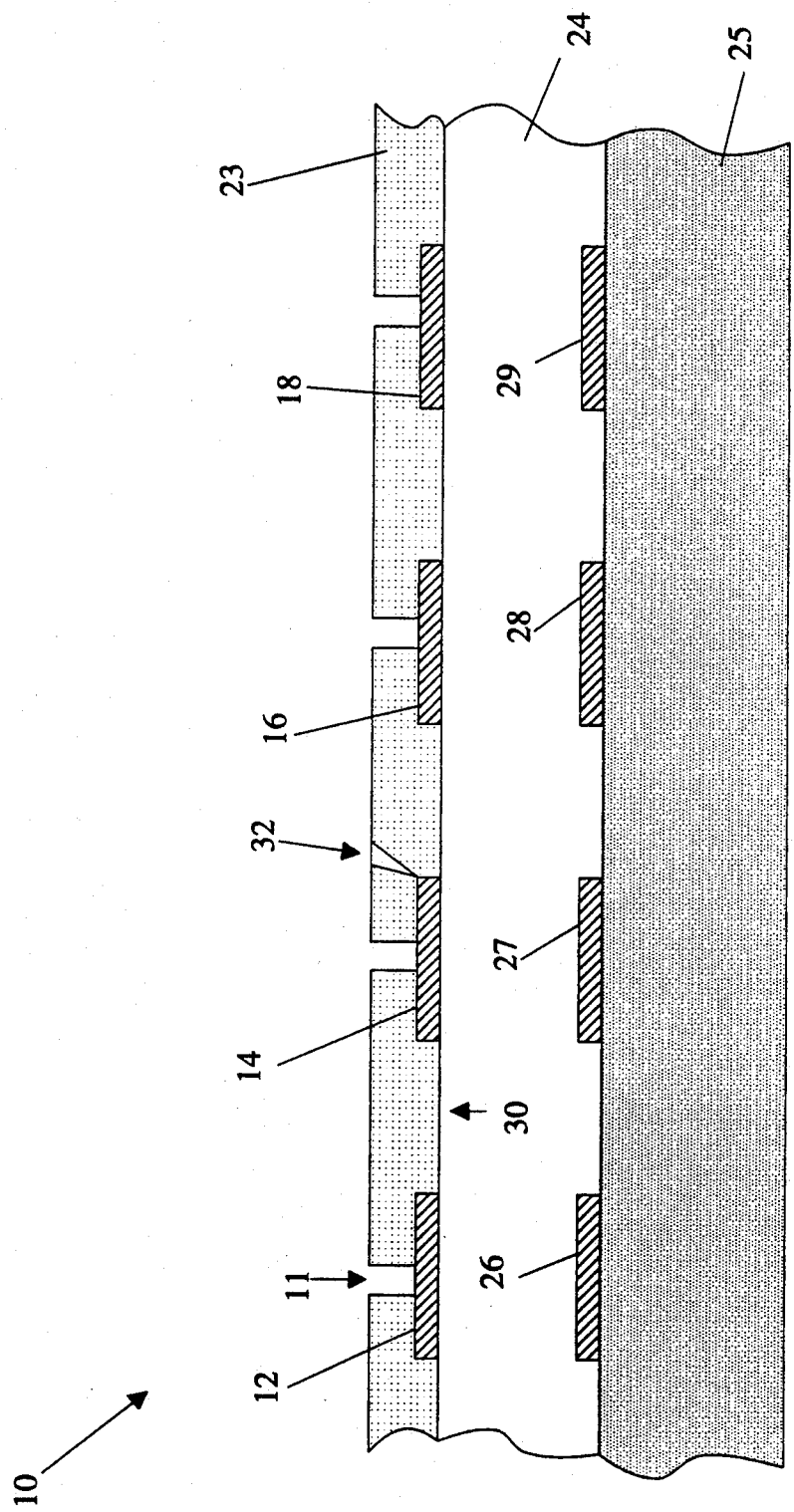
FIG. 2 is a cross-sectional view of the capacitor array shown in FIG. 1

The present invention may be more easily understood in terms of the construction of ferroelectric capacitors. FIGS. 1 and 2 illustrate a typical prior art ferroelectric capacitor array. FIG. 1 is a top view of an integrated circuit 10 having four capacitors. The top electrodes of the capacitors are shown at 12, 14, 16, and 18. FIG. 2 is a cross-sectional view of circuit 10 through line 22-32. The bottom electrodes corresponding to electrodes 12, 14, 16, and 18 are shown at 26-29, respectively. Circuit 10 is typically constructed by depositing a platinum layer on the surface of a silicon substrate 25. The platinum layer is then etched to form the individual bottom electrodes. A layer of ferroelectric material 24 is then deposited over electrodes 26-29. The ferroelectric material is preferably composed of PLZT. A second platinum layer is then deposited on top of layer 24. This layer is then etched to form top electrodes 12, 14, 16, and 18. A layer 23 of $SiO_2$ is then deposited over the top electrodes. Layer 23 provides scratch resistance and an insulating surface on which to deposit various conductors for connecting the capacitors to other circuit elements. Via holes 11 are then etched in layer 23 to provide access to the top electrodes. The bottom electrodes are accessed through via holes 13 which connect to extensions 17 of the bottom electrodes through via holes in PLZT layer 24.

This prior art design has two problems. First, the $SiO_2$ reacts with the PLZT material in regions such as region 30 shown in FIG. 2. This reaction degrades the performance of the capacitors, and can also result in aging effects. Second, layer 23 often exhibits cracks which appear to start at locations in which the edge of the platinum electrodes come in contact with layer 23. Typical cracks are shown at 15 and 32. Such cracks are unacceptable.

The present invention avoids these problems by introducing an isolation layer between the $SiO_2$ and the surfaces having exposed PLZT material or exposed platinum. The isolation layer is constructed from a material that is sufficiently more inert to reactions with PLZT or PZT than $SiO_2$ to avoid the problems from such interactions. In addition, the material must have high resistivity to prevent shorting of the platinum electrodes. The preferred material is $TiO_2$. However, those skilled in the art will recognize that $ZrO_2$, MgO, and a number of compositions of PZT or PLZT can be used for this purpose. In this regard, it must be noted that when PZT or PLZT compositions are utilized for the isolation layer, the process of etching via holes through the isolation layer becomes more difficult. In this case, ion milling is the preferred etching technique.

Figure 3A:
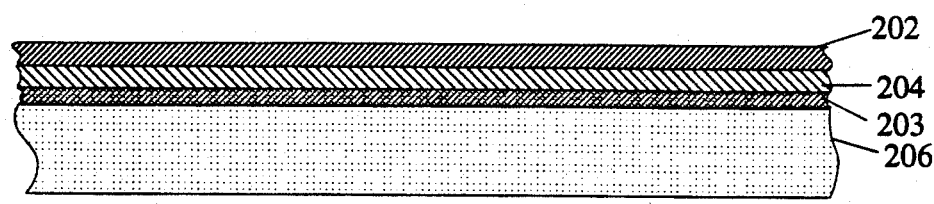
FIGS. 3(A)–(G) are cross-sectional views of a capacitor array constructed according to the present invention at various stages in the construction process.
Figure 3B:
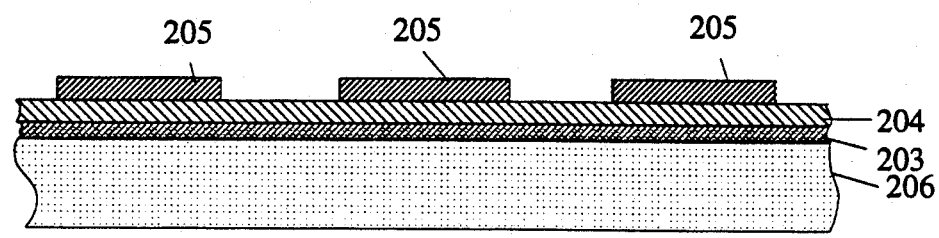
Figure 3C:
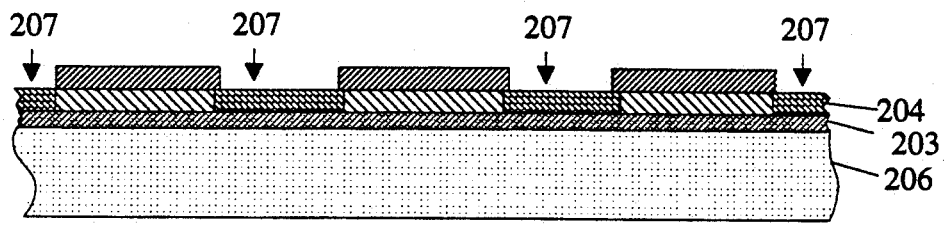

The manner in which this isolation layer is introduced may be more easily understood with reference to FIGS. 3(A)–(G) which are cross-sectional views of a semiconductor substrate at various stages in the construction of an array of PLZT capacitors on the surface of a silicon substrate 206 utilizing a $TiO_2$ isolation layer. In this example, it will be assumed that the capacitor array is to be constructed on top of a $SiO_2$ layer 203 which isolates components in the silicon substrate 206 from the capacitor array. Referring to FIG. 3(A), a 1000 Å thick layer 204 of titanium is first deposited on $SiO_2$ layer 203. This layer will be used to generate the first $TiO_2$ isolation for isolating the array from $SiO_2$ buffer layer 203. Next, a 1000 Å layer 202 of platinum is deposited on layer 204. This layer is masked and etched by conventional techniques to form the bottom electrodes 205 of the capacitor array as shown in FIG. 3(B). If via holes are needed for connecting the electrodes of the capacitor array to the circuitry on substrate 206, these via holes are preferably opened at this stage of the construction as the titanium layer is more easily etched at this point. Such etching is conventional in the semiconductor arts, and hence will not be discussed in more detail here.

After bottom electrodes 205 have been formed and any via holes through layer 204 have been opened, layer 204 is oxidized by heating in an $O_2$ atmosphere at 650° C. This operation generates $TiO_2$ in the exposed regions as shown at 207 in FIG. 3(C). It should be noted that any remaining metallic titanium will be located under the platinum electrodes and will be separated from substrate 206 by the $SiO_2$ layer 203.

Figure 3D:
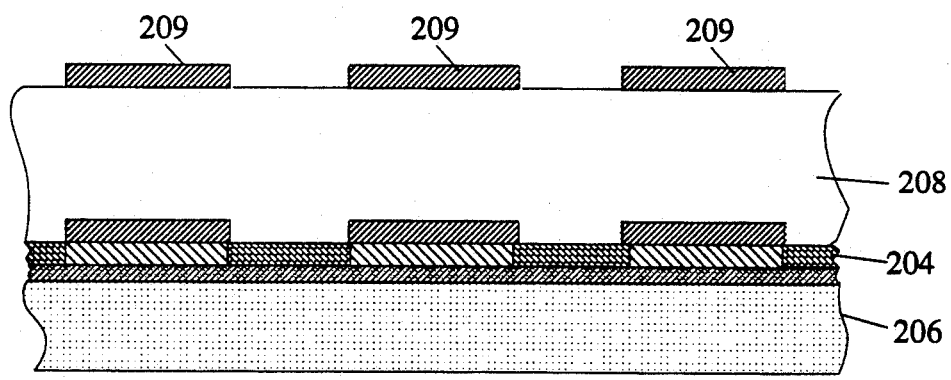

Referring to FIG. 3(D), a layer 208 of PLZT material is then deposited. This layer is deposited using a conventional sol-gel process. PLZT layer 208 is then masked and etched using a conventional buffered-oxide-etch HCl solution. This step provides via holes for making connections to bottom electrodes 205 which serve the same function as via holes 13 shown in FIG. 1. Once the PLZT layer is patterned, a 1000 Å layer of platinum is deposited on PLZT layer 208. This layer is masked and etched to form the top electrodes 209 of the capacitor array.

Figure 3E:
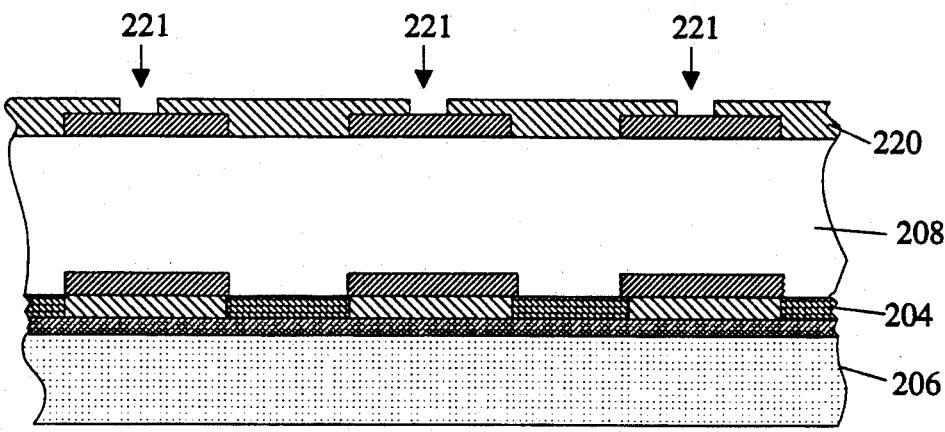

Referring to FIG. 3(E), a 100 Å layer of titanium is then deposited over the exposed portions of the PLZT layer 220 and top electrodes 209. This layer is then masked and etched using buffered-oxide-etch to open via holes 207 for making connections to the top electrodes and corresponding via holes for making connections through the via holes in the PLZT layer described above. This patterning operation is performed before oxidizing the titanium layer because etching $TiO_2$ is very difficult.

Figure 3F:
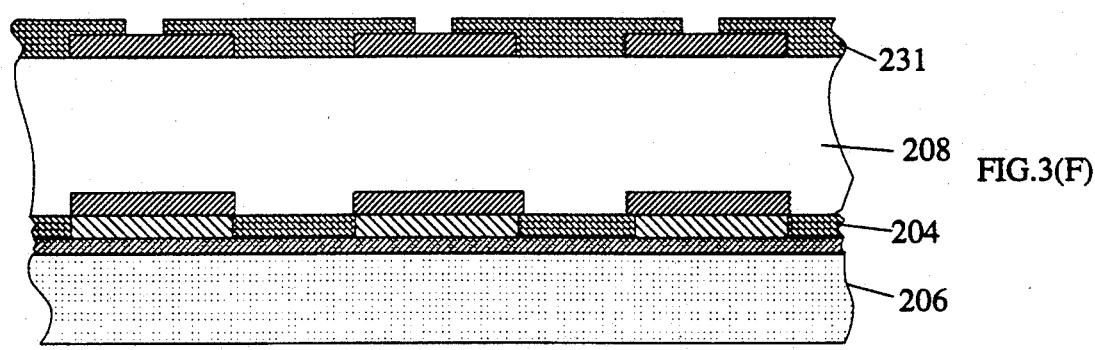
Figure 3G:
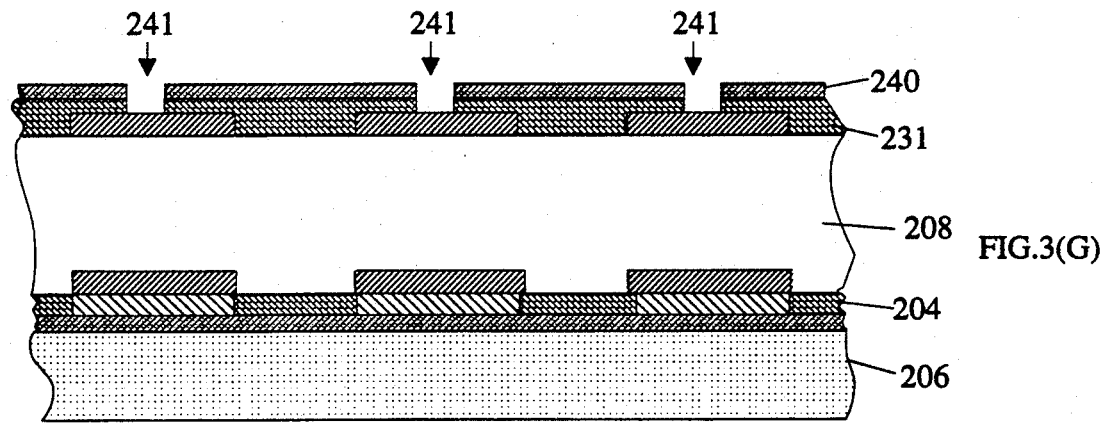

Referring to FIG. 3(F), titanium layer 220 is then oxidized by heating in an $O_2$ atmosphere at 650° C. for 20 minutes to form $TiO_2$ layer 231. Finally, an $SiO_2$ layer 240 is deposited over layer 231 and etched to form via holes for making electrical connections to the electrodes. Exemplary via holes are shown at 241 in FIG. 3(G).

It will be apparent to those skilled in the art that the above described process provides a structure in which the PLZT and platinum layers are isolated from the $SiO_2$ layers. This isolation avoids the problems discussed above.

It will also be apparent to those skilled in the art that titanium may be replaced by magnesium or zirconium in the above described process provided the oxidization times are suitably reduced. Similarly, the $TiO_2$ layer may be replaced by a layer comprising a PZT or PLZT material whose composition provides the electrical insulating characteristics in question.

While the present invention has been described in terms of the construction of a capacitor array, it will be apparent to those skilled in the art that the present invention may be used advantageously in any situation in which either PZT, PLZT, or platinum structures are to be isolated from $SiO_2$ layers to prevent cracking of the $SiO_2$ and/or undesirable interactions between the PZT or PLZT and the $SiO_2$. Various modifications to the present invention will become apparent to those skilled in the art from the foregoing description and accompanying drawings. Accordingly, the present invention is to be limited solely by the scope of the following claims.

What is claimed is:

1. An improved integrated circuit structure comprising:
    a layer of $SiO_2$;
    an isolation since this obviously was intended which is substantially inert with respect to said layer of $SiO_2$ and which is substantially an electrical insulator; and
    an electrode layer of material chosen from the group PZT, PLZT, or platinum, wherein said isolation layer is disposed between, and in contact with, said layer of $SiO_2$ and said electrode layer, and wherein said isolation layer is substantially inert with respect to said electrode layer.

2. The structure of claim 1 wherein said isolation layer comprises $TiO_2$, $ZrO_2$, MgO, PZT, or PLZT.

3. A method for isolating a first layer including $SiO_2$ from a second layer in an integrated circuit comprising the steps:
  depositing a bottom layer comprising either said first layer of said second layer;
  depositing a third layer of material which is substantially inert with respect to $SiO_2$ and said first and second layers and which is substantially an electrical insulator, said third layer being deposited on said bottom layer; and
  depositing the other of said first and second layers on said third layer.

4. The method of claim 3 wherein said step of depositing said third layer comprises the steps of:
  depositing a layer of titanium, magnesium, or zirconium; and
  oxidizing said layer.

5. The method of claim 4 further comprising the step of patterning said layer of titanium, magnesium, or zirconium prior to oxidizing said layer.

6. A ferroelectric capacitor structure comprising:
  a first layer comprising $SiO_2$;
  a first electrode comprising a second layer, said second layer comprising a conducting material;
  a third layer comprising a ferroelectric material, said third layer overlying said first electrode and extending laterally beyond said first electrode;
  a fourth layer of a substantially electrical insulating material which is substantially inert with respect to said ferroelectric material, said fourth layer being disposed adjacent to said first layer so as to prevent contact between said ferroelectric material and said first layer or said second layer.

7. The capacitor structure of claim 6 wherein said conducting material comprises platinum.

8. The capacitor structure of claim 6 wherein said ferroelectric material comprises PZT or PLZT.

9. The capacitor structure of claim 6 wherein said substantially electrical insulating material is $TiO_2$, $ZrO_2$, MgO, PZT, or PLZT.

* * * * *

UNITED STATES PATENT AND TRADEMARK OFFICE
CERTIFICATE OF CORRECTION

PATENT NO. : 5,212,620
DATED : May 18, 1993
INVENTOR(S) : Evans, et al.

It is certified that error appears in the above-identified patent and that said Letters Patent is hereby corrected as shown below:

On the title page, after item 57 Abstract, the,
*Attorney, Agent, or Firm*: "Bartles" should be --Bartels--.

Column 1, line 13, "Semiconductorbased" should be --Semiconductor-based--.

Column 4, line 57, delete "since this obviously was intended" and insert therefor --layer--.

Signed and Sealed this

Thirtieth Day of August, 1994

*Attest:*

BRUCE LEHMAN

*Attesting Officer*     *Commissioner of Patents and Trademarks*